United States Patent
Tanaka et al.

(10) Patent No.: US 8,472,109 B2
(45) Date of Patent: Jun. 25, 2013

(54) SEMICONDUCTOR OPTICAL AMPLIFIER AND OPTICAL MODULE

(75) Inventors: Shinsuke Tanaka, Kawasaki (JP); Shigeaki Sekiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 721 days.

(21) Appl. No.: 12/636,209

(22) Filed: Dec. 11, 2009

(65) Prior Publication Data
US 2010/0245990 A1 Sep. 30, 2010

(30) Foreign Application Priority Data
Mar. 27, 2009 (JP) .................. 2009-078361

(51) Int. Cl.
| H01S 5/028 | (2006.01) |
| H01S 5/026 | (2006.01) |
| H01S 5/068 | (2006.01) |
| H01S 5/34 | (2006.01) |
| H01S 5/22 | (2006.01) |
| H01S 5/10 | (2006.01) |

(52) U.S. Cl.
CPC ........... *H01S 5/0288* (2013.01); *H01S 5/0268* (2013.01); *H01S 5/06817* (2013.01); *H01S 5/34* (2013.01); *H01S 5/2206* (2013.01); *H01S 5/101* (2013.01)
USPC ...................... 359/344; 372/50.11

(58) Field of Classification Search
USPC ....................... 359/344; 372/50.11
IPC ............... H01S 3/0619,3/0621, 3/0623, 3/0632, H01S 3/0635, 3/093, 3/1628, 5/041, 5/22, H01S 5/2206, 5/2207, 5/0288
See application file for complete search history.

(56) References Cited

U.S. PATENT DOCUMENTS

| 4,680,769 | A | * | 7/1987 | Miller | 372/50.22 |
| 4,928,285 | A | * | 5/1990 | Kushibe et al. | 372/45.01 |
| 5,119,393 | A | * | 6/1992 | Oka et al. | 372/50.22 |
| 5,184,247 | A | * | 2/1993 | Schimpe | 359/344 |
| 5,253,262 | A | * | 10/1993 | Kurobe et al. | 372/45.01 |
| 5,299,045 | A | * | 3/1994 | Sekiguchi | 398/95 |
| 5,436,920 | A | * | 7/1995 | Minemoto et al. | 372/21 |
| 5,537,433 | A | * | 7/1996 | Watanabe | 372/45.01 |
| 5,731,602 | A | * | 3/1998 | Pan et al. | 257/98 |

(Continued)

FOREIGN PATENT DOCUMENTS

| GB | 2388706 A | * | 11/2003 |
| JP | 2000-174383 A | | 6/2000 |
| JP | 2004-266095 A | | 9/2004 |
| JP | 2007-067222 A | | 3/2007 |

OTHER PUBLICATIONS

F. Girardin et al, "Gain Recovery of Bulk Semiconductor Optical Amplifiers", IEEE Photonics Technology Letters, vol. 10, No. 6, Jun. 1998.

(Continued)

*Primary Examiner* — Mark Hellner
*Assistant Examiner* — Ari M. Diacou
(74) *Attorney, Agent, or Firm* — Westerman, Hattori, Daniels & Adrian, LLP

(57) ABSTRACT

A semiconductor optical amplifier includes a semiconductor substrate; an optical waveguide that includes an active layer formed on the semiconductor substrate; and a wavelength selective reflection film that is formed on an end face where signal light is incident on the optical waveguide the wavelength selective reflection film allows transmission of the signal light, and reflects light of any wavelength other than the signal light.

18 Claims, 18 Drawing Sheets

U.S. PATENT DOCUMENTS

| | | | |
|---|---|---|---|
| 5,845,030 A * | 12/1998 | Sasaki et al. | 385/88 |
| 6,039,632 A * | 3/2000 | Robertson | 451/41 |
| 6,115,178 A * | 9/2000 | Naganuma et al. | 359/485.03 |
| 6,205,159 B1 * | 3/2001 | Sesko et al. | 372/20 |
| 6,563,631 B2 * | 5/2003 | Delprat et al. | 359/344 |
| 6,658,037 B2 * | 12/2003 | Kahen et al. | 372/70 |
| 6,819,692 B2 * | 11/2004 | Klimov et al. | 372/39 |
| 6,879,618 B2 * | 4/2005 | Cok et al. | 372/70 |
| 7,203,409 B2 * | 4/2007 | Merritt et al. | 385/129 |
| 7,300,809 B2 * | 11/2007 | Anikitchev et al. | 438/22 |
| 7,542,201 B2 | 6/2009 | Tanaka et al. | |
| 8,068,525 B2 * | 11/2011 | Yamamoto et al. | 372/36 |
| 2002/0064203 A1 * | 5/2002 | Pezeshki et al. | 372/64 |
| 2002/0067540 A1 * | 6/2002 | Delprat et al. | 359/344 |
| 2002/0110328 A1 * | 8/2002 | Bischel et al. | 385/49 |
| 2002/0114367 A1 * | 8/2002 | Stintz et al. | 372/45 |
| 2002/0179929 A1 * | 12/2002 | Takahashi et al. | 257/184 |
| 2003/0128922 A1 * | 7/2003 | Kolodziejski et al. | 385/27 |
| 2003/0174393 A1 * | 9/2003 | Maeda et al. | 359/344 |
| 2004/0099858 A1 * | 5/2004 | Lee | 257/13 |
| 2004/0124409 A1 * | 7/2004 | Ebe et al. | 257/14 |
| 2004/0213315 A1 * | 10/2004 | Kume et al. | 372/50 |
| 2005/0078359 A1 * | 4/2005 | Kim et al. | 359/344 |
| 2005/0090030 A1 * | 4/2005 | Sridharan et al. | 438/33 |
| 2005/0175044 A1 * | 8/2005 | Zakhleniuk et al. | 372/20 |
| 2009/0252191 A1 * | 10/2009 | Kubota et al. | 372/50.11 |
| 2010/0303112 A1 * | 12/2010 | Yamamoto et al. | 372/36 |
| 2010/0303120 A1 * | 12/2010 | Yamamoto et al. | 372/66 |
| 2011/0200292 A1 * | 8/2011 | Filgas | 385/129 |

OTHER PUBLICATIONS

Japanese Office Action dated Mar. 26, 2013, issued in corresponding Japanese Patent Application No. 2009-078361, w/ partial English translation.

Ahn et al., "Gain clamping scheme of a semiconductor optical amplifier by using an amplified spontaneous emission reflector", Conference Proceedings of Lasers and Electro-Optics Society (LEOS) Annual Meeting, vol. 2, p. 888-889 (2003); cited in Japanese Office Action dated Mar. 26, 2013.

Ahn et al., "Gain-clamped semiconductor optical amplifier based on compensating light generated from amplified spontaneous emission", Electronics Letter, vol. 39, No. 15, pp. 1140-1141 (2003); cited in Japanese Office Action dated Mar. 26, 2013.

* cited by examiner

SEMICONDUCTOR OPTICAL AMPLIFIER AND OPTICAL MODULE

CROSS-REFERENCE TO RELATED APPLICATIONS

This application is based upon and claims the benefit of priority of the prior Japanese Patent Application No. 2009-078361, filed on Mar. 27, 2009, the entire contents of which are incorporated herein by reference.

FIELD

The present invention relates to a semiconductor optical amplifier and an optical module.

BACKGROUND

With a dramatic increase in communication demand in recent years, the scope of application of a photonic network is becoming increasingly wider and also the capacity and functionality of networks are increasing. A semiconductor optical amplifier (SOA) has, when compared with an optical fiber amplifier module, a very simple configuration. Thus, the SOA has been examined for application to a network as a small and low power consumption optical amplifier. Moreover, the SOA has high non-linearity in optical gain and is promising as an active element used for various kinds of signal processing such as optical signal regeneration and optical wavelength conversion. A structure in which an antireflection film is formed on both surface on which signal light is incident and a surface from which the signal light is emitted is known as such an SOA (see, for example, Japanese Laid-open Patent Publication No. 2007-67222).

When an SOA is used as an optical amplifier or an optical signal processing element in a photonic network, high-speed gain response is desired. However, the SOA has a gain saturation phenomenon in which the optical gain decreases with increasing optical output from the SOA. The gain saturation phenomenon notably occurs generally in an optical output range of +0 dBm to +10 dBm. For example, when an intensity modulated signal light having a modulation rate of 10 Gbps or more is amplified up to the power regime where the gain of an SOA saturates, a pattern effect due to the gain saturation phenomenon appears and the waveform of an output signal light is deteriorated significantly, leading to lower communication quality. Waveform deterioration of signal light due to the pattern effect is a phenomenon that occurs because a modulation rate of the signal light and a gain response speed in the SOA are at a comparable speed.

Incidentally, it is known that the gain response speed in an SOA is determined by the lifetime of carriers (electrons or holes) contributing to an optical gain in an active layer of the SOA. The lifetime of carriers in an active layer is generally determined by active layer materials and doping conditions of impurities, and it is difficult to achieve a significant speedup by changing the active layer materials or optimizing the structure of an SOA. Thus, a method of external optical injection and a method of an optical self-saturation effect via amplified spontaneous emission (ASE) light are known as methods to increase the gain response speed of an SOA (see, for example, F. Girardin, G. Guekos, and A. Houbavlis, "Gain Recovery of Bulk Semiconductor Optical Amplifiers", IEEE PHOTONICS TECHNOLOGY LETTERS, VOL. 10, No. 6, JUNE 1998).

However, according to the method of external optical injection, it is necessary to set up an additional light source outside the SOA, and the structure thereof becomes more complex, making the method inappropriate for miniaturization. According to the method of an optical self-saturation effect via ASE light, an external light source or the like is not needed, but it is necessary to sufficiently increase intensity of ASE light to saturate the active layer of an SOA in advance. Thus, it is necessary to set the length of SOA chip longer than that of an ordinary one. However, it also causes a large increase of the total power consumption of SOA because the drive current of SOA increases in propotion to its length under constant drive current density.

SUMMARY

According to an aspect of the invention, a semiconductor optical amplifier includes a semiconductor substrate; an optical waveguide that includes an active layer formed on the semiconductor substrate; and a wavelength selective reflection film that is formed on an end face of the optical waveguide, transmits signal light, and reflects light of any wavelength other than the signal light.

According to another aspect of the invention, a semiconductor optical amplifier including a semiconductor substrate; an optical waveguide that includes an active layer formed on the semiconductor substrate; and a diffraction grating that is formed above and/or below the optical waveguide on a side on which signal light is input to the optical waveguide, transmits the signal light, and reflects light of any wavelength other than the signal light.

According to another aspect of the invention, an optical module including a semiconductor optical amplifier including: a semiconductor optical amplifier including: a semiconductor substrate; an optical waveguide that includes an active layer formed on the semiconductor substrate; and a wavelength selective reflection film that is formed on an end face of the optical waveguide, transmits the signal light, and reflects light of any wavelength other than the signal light; an optical element that causes the signal light to be incident on the optical waveguide in the semiconductor optical amplifier; and an optical element that outputs the signal light emitted from the optical waveguide in the semiconductor optical amplifier.

According to another aspect of the invention, a optical module including A optical module comprising: a semiconductor optical amplifier including: a semiconductor substrate; an optical waveguide that includes an active layer formed on the semiconductor substrate; and a diffraction grating that is formed above and/or below the optical waveguide on a side on which signal light is input to the optical waveguide, transmits the signal light, and reflects light of any wavelength other than the signal light; an optical element that causes the signal light to be incident on the optical waveguide in the semiconductor optical amplifier; and an optical element that outputs the signal light emitted from the optical waveguide in the semiconductor optical amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

[First Embodiment]

Related Art

First, ASE light intensity distribution will be described. FIG. 1 illustrates the structure of a semiconductor optical amplifier of the related art and an intensity distribution of ASE light inside the SOA chip.

Figure 1A:
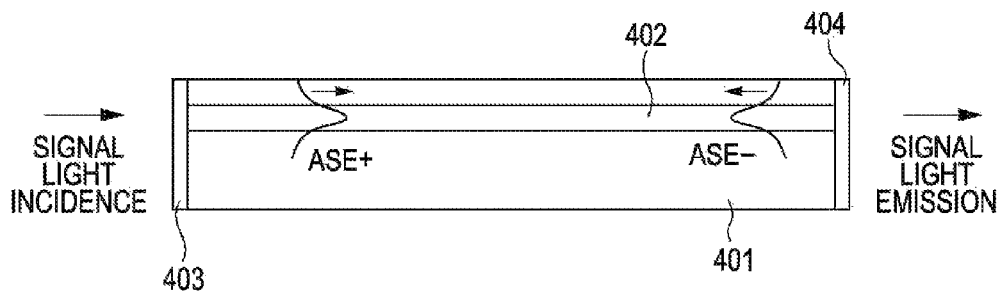
FIGS. 1A and 1B are explanatory views of a semiconductor optical amplifier of the related art.

The semiconductor optical amplifier illustrated in FIG. 1A is constructed by placing an active layer 402 which forms an optical waveguide on a semiconductor substrate 401, and the active layer 402 is sandwiched by clad layers (not illustrated). Moreover, antireflection films 403 and 404 to prevent reflection on each end facets are formed on an incidence surface and an emission surface of the semiconductor optical amplifier, respectively. The length of the semiconductor optical amplifier along the direction of signal light propagation is, for example, approximately 900 µm.

Figure 1B:
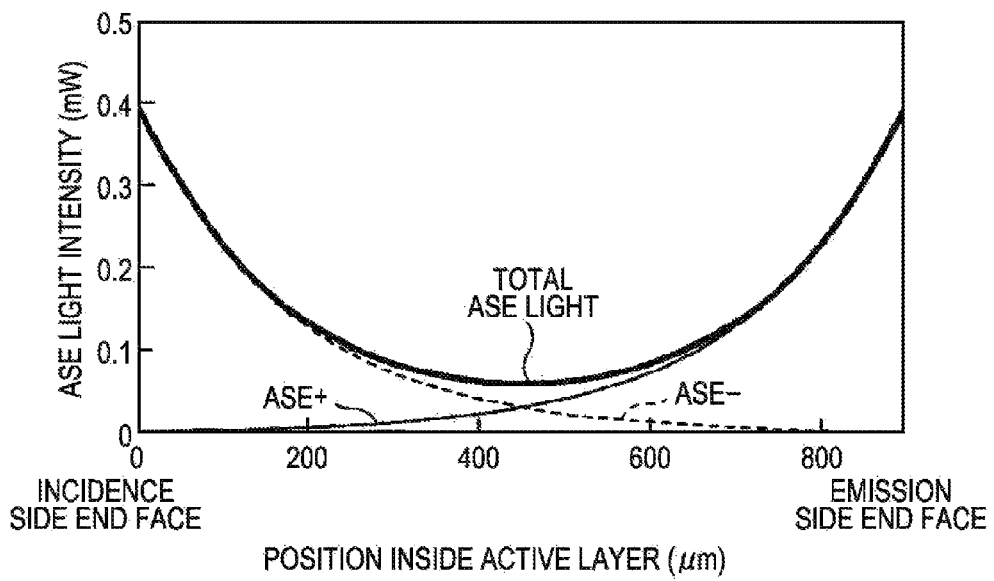

FIG. 1B illustrates a relationship between the position of the active layer of the semiconductor optical amplifier in the horizontal direction on the drawing and ASE light intensity. The ASE light is generated by spontaneous emission which is uniformly generated throughout the active layer 402, and amplified by an optical gain while it propagates along the optical waveguide. The ASE light has two components of light (ASE+) which propagates to the same direction as signal light and a light (ASE−) which propagates to the opposite direction from signal light. The sum of intensity of ASE+ and that of ASE− becomes the intensity of the total ASE light.

Since ASE+ and ASE− have high intensity near the end faces of the active layer 402, the total ASE intensity also becomes high at both ends. As illustrated in FIG. 1B, the peak value of intensity of the total ASE light is about 0.4 mW. In such a semiconductor optical amplifier, a method of elongating the semiconductor optical amplifier in the traveling direction of signal light (a method of elongation in the horizontal direction on a drawing) is effective as a method of increasing ASE light intensity, but this method is not preferable because, as described above, a driving current increases.

Figure 2A:
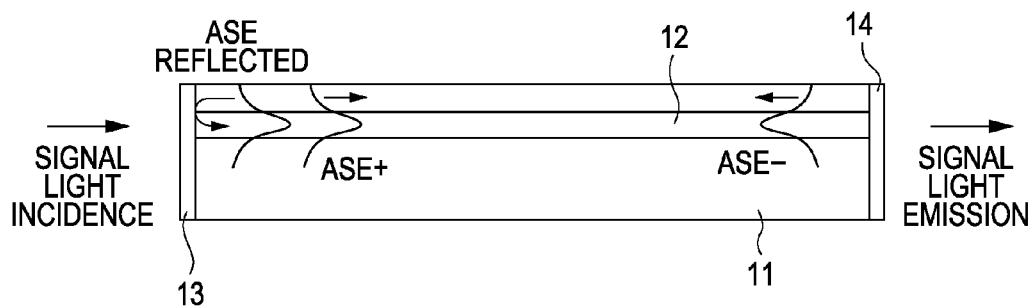
FIGS. 2A and 2B are explanatory views of the semiconductor optical amplifier in a first embodiment.

Next, the semiconductor optical amplifier in the present embodiment will be described based on FIGS. 2A and 2B. As illustrated in FIG. 2A, the semiconductor optical amplifier in the present embodiment is constructed by an active layer 12 which formes an optical waveguide on a semiconductor substrate 11, and the active layer 12 is sandwiched by clad layers (not illustrated) provided thereon and thereunder. A wavelength selective reflection film 13 is formed on the incidence surface of signal light of the semiconductor optical amplifier and an antireflection film 14 is formed on the emission surface of the signal light. The length of the semiconductor optical amplifier along the traveling direction of the signal light is, for example, approximately 900 µm.

Figure 3:
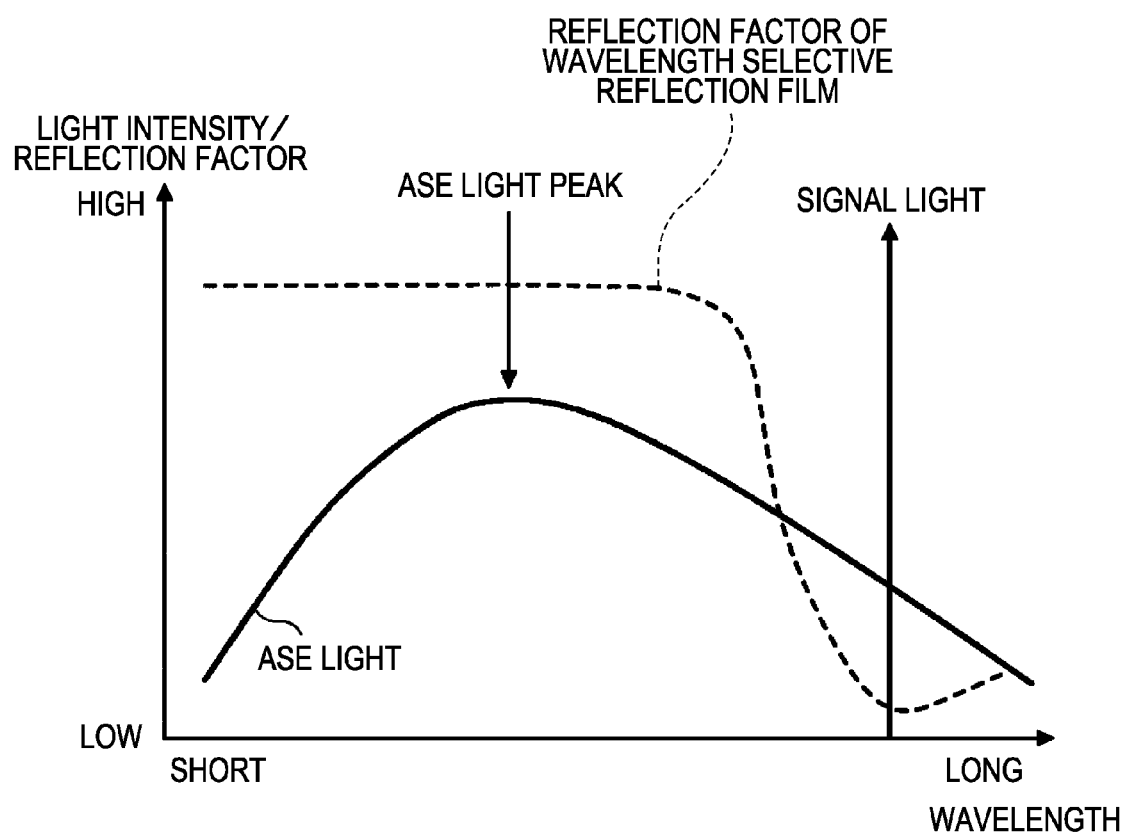
FIG. 3 is a characteristics diagram of an optical spectrum and a reflection factor of a wavelength selective reflection film.

Next, the wavelength selective reflection film 13 in the semiconductor optical amplifier according to the present embodiment will be described based on FIG. 3. FIG. 3 illustrates wavelength dependence of reflection factor of the wavelength selective reflection film 13 and the wavelength deployments of ASE light and signal light. The wavelength of signal laser light is set to longer wavelength than a peak wavelength of ASE light generated in the active layer 12 of the semiconductor optical amplifier and the peak wavelength of ASE light and the wavelength of the signal light are different. The wavelength selective reflection film 13 exhibits a high reflection factor with respect to ASE light and a low reflection factor with respect to signal light such that the signal light is passed through.

By providing the wavelength selective reflection film 13 described above, a semiconductor optical amplifier in the present embodiment can cause the light (ASE−) propagating in the direction opposite to the signal light to reflect on the incidence surface of the signal light causing almost no optical loss of the signal light.

Figure 2B:
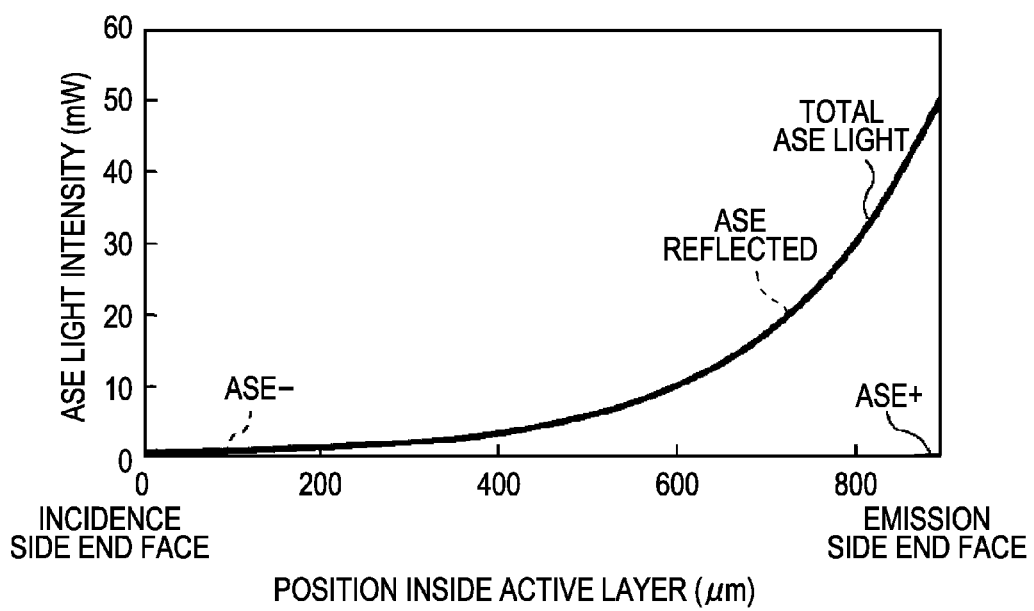

FIG. 2B illustrates a relationship between the position of the active layer of the semiconductor optical amplifier in the present embodiment in the traveling direction of signal light and ASE light intensity. In the active layer 12, a light (ASE+) propagating in the same direction as signal light and a light (ASE−) propagating in the opposite direction are generated. Of these lights, ASE− is reflected by the wavelength selective reflection film 13 to become a light (ASE reflected) propagating in the same direction as the signal light, and (ASE reflected) is further amplified during its propagation toward output facet by an optical gain in optical active layer. Thus, intensity of the total ASE light, which is the sum of intensity of ASE+, that of ASE−, and that of ASE reflected, becomes much higher at the end of the active layer 12 on the emission side of signal light. As illustrated in FIG. 2B, the peak value of intensity of the total ASE light reaches about 50 mW. Thus, even if the length of a semiconductor optical amplifier in the traveling direction of signal light is made the same as the that of prior, intensity of ASE light can be made much higher. Incidentally, the wavelength selective reflection film 13 in a semiconductor optical amplifier according to the present embodiment has, for example, reflectivity of about 80% for ASE light.

Figure 4A:
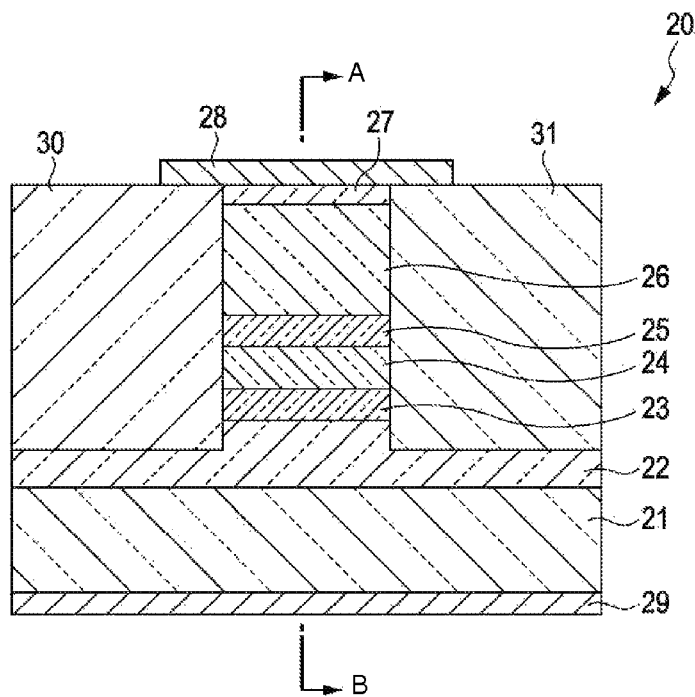
FIGS. 4A and 4B are structure diagrams of the semiconductor optical amplifier in the first embodiment.
Figure 4B:
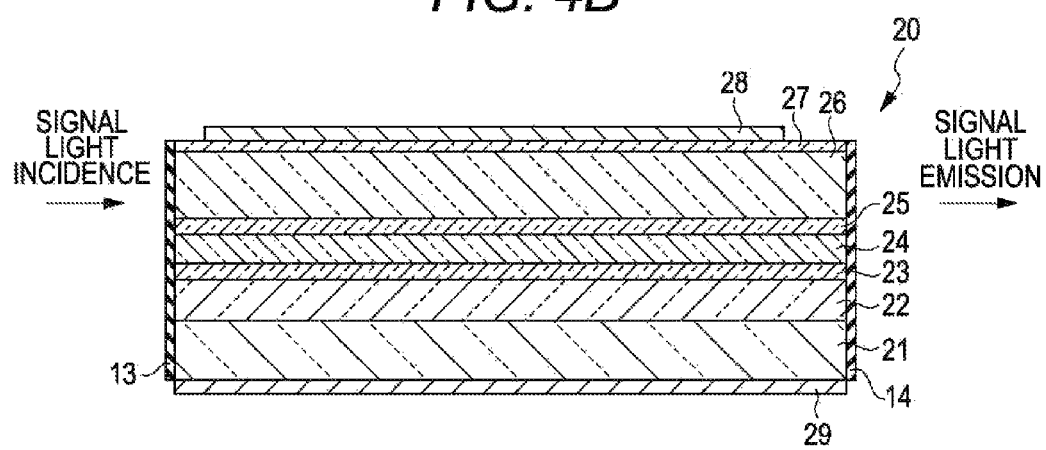

FIG. 4A is a sectional view of the semiconductor optical amplifier on a surface substantially perpendicular to the traveling direction of signal light and FIG. 4B is a sectional view of a section cut along a chain line A-B in FIG. 4A. A semiconductor optical amplifier 20 includes, for example, an n-type InP clad layer 22, InGaAsP optical confinement layer 23, InGaAs active layer 24, InGaAsP optical confinement layer 25, p-type InP clad layer 26, and InGaAsP contact layer 27 laminated on an n-type InP substrate 21. Further, for example, an anode electrode 28 is formed on the InGaAsP contact layer 27 and a cathode electrode 29 is formed on a surface opposite to the surface on which the n-type InP clad layer 22 of the n-type InP substrate 21 is formed. The InGaAsP optical confinement layer 23 and the InGaAsP optical confinement layer 25 may also be referred to as a separate confinement heterostructure (SCH) layer.

The InGaAsP optical confinement layer 23, the InGaAs active layer 24, the InGaAsP optical confinement layer 25, the p-type InP clad layer 26, the InGaAsP contact layer 27, and a portion of the n-type InP clad layer 22 have a mesa structure. Semi-insulating (i-type) InP block layers 30 and 31 are provided on the side surface of the mesa structure. Further, the wavelength selective reflection film 13 is formed on the incidence surface of signal light and the antireflection film 14 is formed on the emission surface of the signal light.

Next, the manufacturing method of a semiconductor optical amplifier in the present embodiment will be described based on FIGS. 5A to 5D. FIGS. 5A to 5D are sectional views of the semiconductor optical amplifier on a surface substantially perpendicular to the traveling direction of signal light.

Figure 5A:
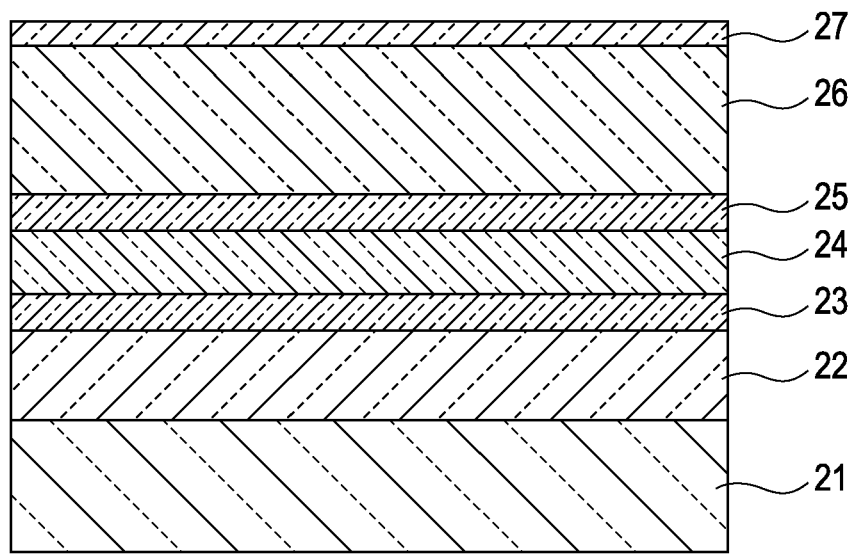
FIGS. 5A to 5D are manufacturing process diagrams of the semiconductor optical amplifier in the first embodiment.

As illustrated in FIG. 5A, the n-type InP clad layer (film thickness: about 100 nm to 3000 nm), the InGaAsP optical confinement layer 23 (film thickness: about 10 nm to 300 nm), the InGaAs active layer 24 (film thickness: about 10 nm to 500 nm), the InGaAsP optical confinement layer 25 (film thickness: about 10 nm to 300 nm), the p-type InP clad layer 26 (film thickness: about 300 nm to 4000 nm), and the InGaAsP contact layer 27 (film thickness: about 100 nm to 1000 nm) are formed on the n-type InP substrate 21. The formation method is the metal organic vapor phase epitaxy (MOVPE) method or the like and laminates are formed by epitaxial growth.

Figure 5B:
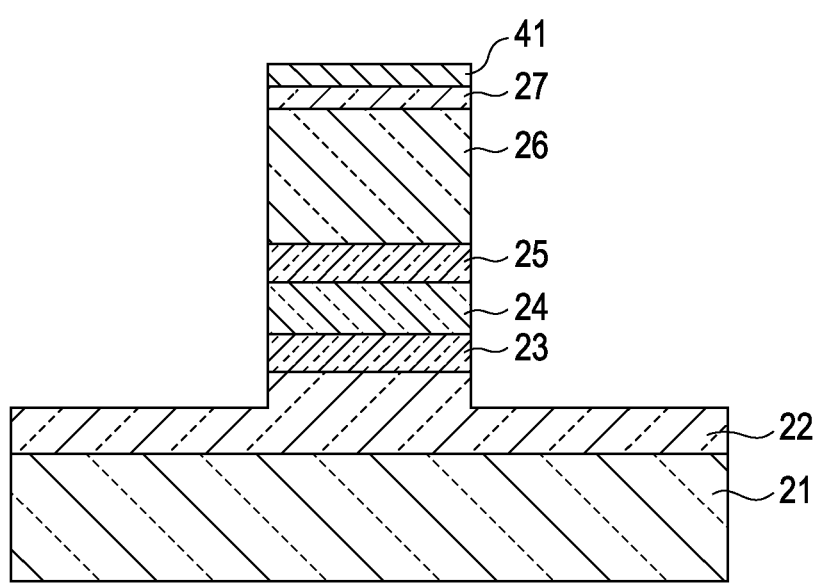

Next, as illustrated in FIG. 5B, a region to become an optical waveguide is processed to a mesa structure. For example, an $SiO_2$ (silicon dioxide) mask 41 is formed on the InGaAsP contact layer 27. The $SiO_2$ (silicon dioxide) mask 41 is patterned by removing the $SiO_2$ film in a region where no resist pattern is formed using the resist pattern formed by photolithography as a mask. An etching method such as reactive ion etching (RIE) is used to remove the $SiO_2$ film and then, the resist pattern is removed. Next, the $SiO_2$ mask 41 is used to process the InGaAsP optical confinement layer 23, the InGaAs active layer 24, the InGaAsP optical confinement layer 25, the p-type InP clad layer 26, the InGaAsP contact layer 27, and a portion of the n-type InP clad layer 22 (remaining film thickness: about 0 nm to 3000 nm) to a mesa structure. Processing to a mesa structure is performed by dry etching or the like using the $SiO_2$ mask 41.

Figure 5C:
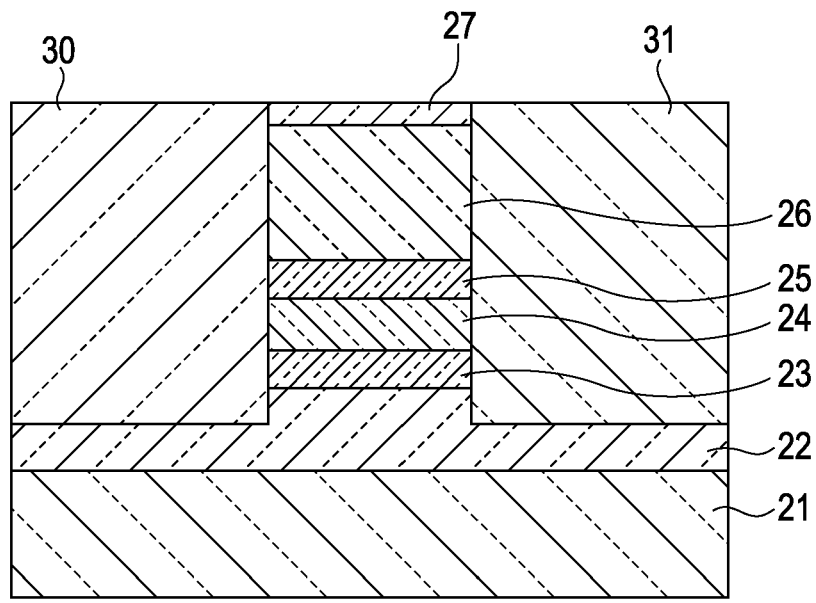

Next, as illustrated in FIG. 5C, i-type InP block layers 30 and 31 are formed on the side surface processed to the mesa structure by the MOVPE method or the like. More specifically, the i-type InP block layers 30 and 31 are formed by MOVPE-growing an i-type InP film with high resistance on the dry-etched surface of the n-type InP clad layer 22 and then, the $SiO_2$ mask 41 is removed. The i-type InP block layers 30 and 31 formed on both sides of the InGaAs active layer 24 will become a current narrowing layer.

Figure 5D:
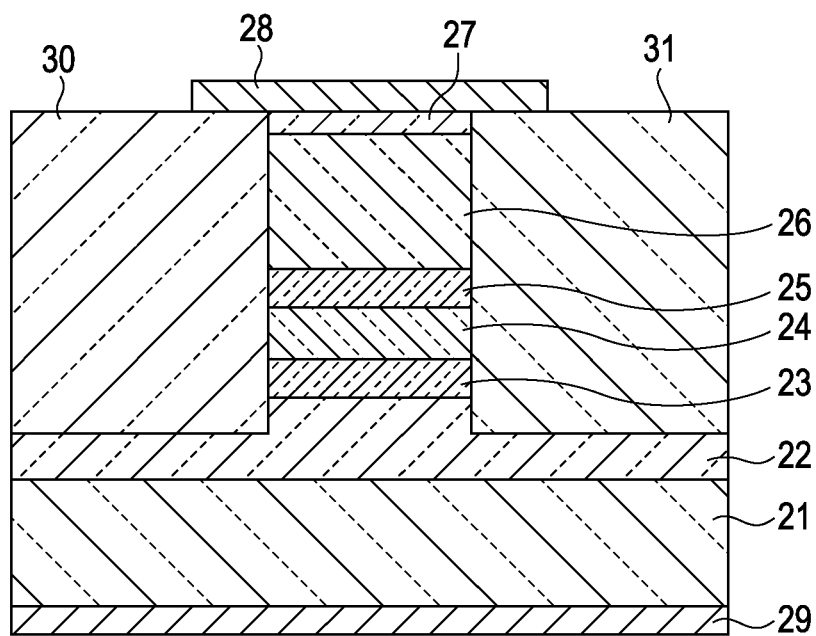

Next, as illustrated in FIG. 5D, the anode electrode 28 and the cathode electrode 29 are formed. For example, the anode electrode 28 is formed on the InGaAsP contact layer 27 and the cathode electrode 29 is formed on the underside of the n-type InP substrate 21. For example, Au (about 100 nm to 2000 nm), Zn (about 100 nm to 2000 nm), or Au (about 100 nm to 5000 nm) may be used as the configuration of both electrodes.

Figure 6:
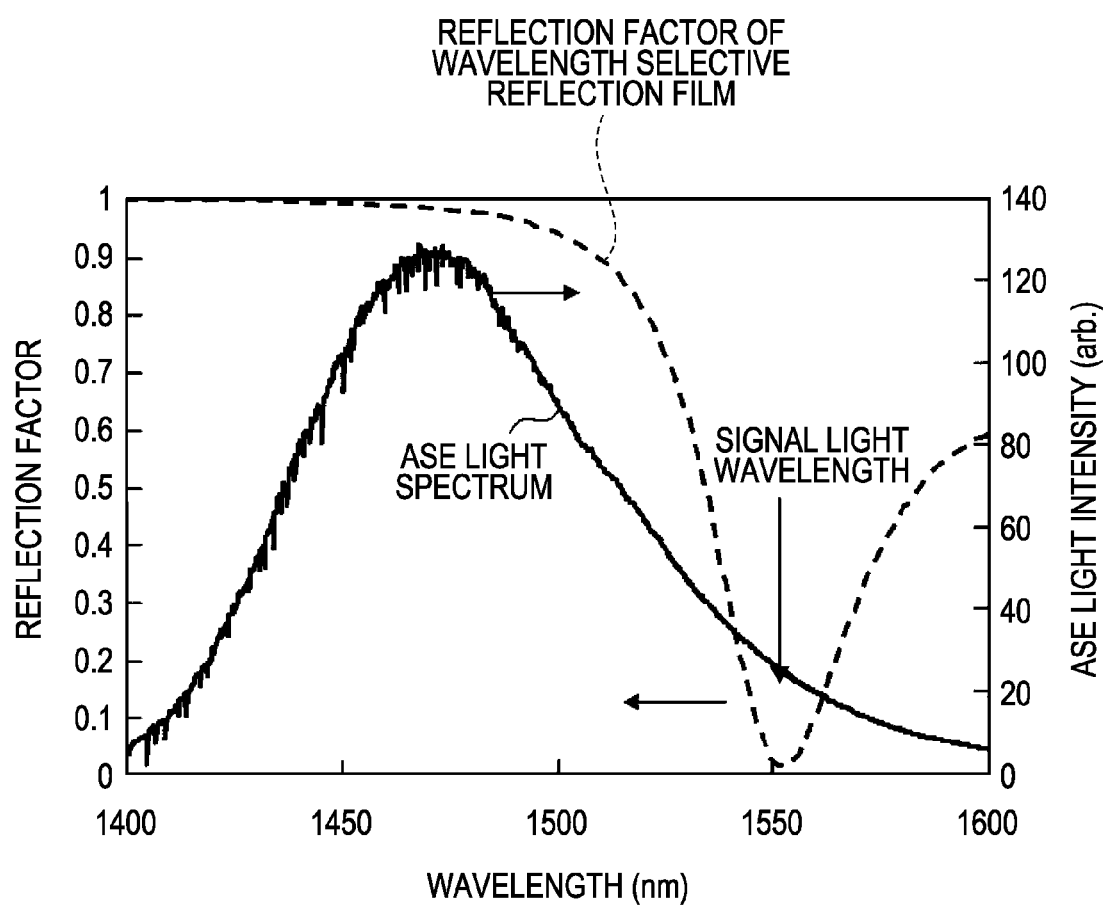
FIG. 6 is a characteristics diagram of an ASE light spectrum and the reflection factor of the wavelength selective reflection film.

Then, an incidence surface and an emission surface of signal light are formed by cleaving surfaces substantially perpendicular to the traveling direction of signal light. Then, on the end face on the emission side of the signal light, for example, an $SiO_2$ (silicon oxide) film with a refractive index of about 1.44 and thickness of about 100 nm and $TiO_2$ (titanium oxide) with the refractive index of about 2.4 and thickness of about 300 nm are alternately formed to build a dielectric multi-layer film in which, for example, eight pairs of SiO2 and TiO2 film are formed alternatively to result in the antireflection film 14. For example, the EB (electron beam) evaporation method is used to form each film. The antireflection film 14 is used to prevent reflection of ASE light and signal light. Moreover, on the end face on the incidence side of the signal light, for example, an $SiO_2$ film with the thickness of about 190 nm and $TiO_2$ with the thickness of about 150 nm are alternately formed to build a dielectric multi-layer film in which, for example, eight pairs of SiO2 and TiO2 are formed alternatively to result in the wavelength selective reflection film 13. The wavelength selective reflection film 13 is used to reflect ASE light and transmit signal light. For example, the EB (electron beam) evaporation method is used to form each film. Here, the number of repeated layers of the wavelength selective reflection film is not limited to eight layers and may use a single layer to 20 layers or more in accordance with reflection characteristics necessary for the wavelength selective reflection film. More specifically, if the shape of reflection spectrum should be made steeper (the slope forming a transmission waveband in FIG. 6 is close to perpendicular), a larger number of repeated layers are selected and, if steepness is not necessary, a smaller number of repeated layers are selected. The thickness of each layer is adjusted in the range of 10 nm to 500 nm in accordance with the necessary transmission center wavelength. Any material having the refractive index of 1.5 to 3.0 may be used as the film material. Accordingly, the semiconductor optical amplifier 20 illustrated in FIG. 4B can be fabricated.

In the semiconductor optical amplifier 20 according to the present embodiment, instead of the n-type InP substrate 21, an n-type GaAs substrate may be used. For the film formation of the n-type InP clad layer 22, the InGaAsP optical confinement layer 23, the InGaAs active layer 24, the InGaAsP optical confinement layer 25, the p-type InP clad layer 26, and the InGaAsP contact layer 27, the molecular beam epitaxy (MBE) method or the like may be used.

FIG. 6 illustrates a spectrum of reflection factor of the wavelength selective reflection film 13 and ASE light. The wavelength selective reflection film 13 has a reflection factor of 90% or more at the peak wavelength 1470 nm of the ASE light and that of about 1% at the wavelength 1550 nm of the signal light so that while the wavelength selective reflection film 13 functions as a reflective film for ASE light, the signal light passes through the wavelength selective reflection film 13 without being reflected. Thus, the ASE light can be caused to reflect with a high reflection factor with almost no optical loss for the signal light.

The semiconductor optical amplifier 20 in the present embodiment includes the wavelength selective reflection film 13 formed on one end face thereof and the antireflection film 14 formed on the other end face and thus does not have a function as a resonator. Therefore, no laser oscillation will occur in the semiconductor optical amplifier 20.

Next, ASE light generated by the semiconductor optical amplifier in the present embodiment will be described with reference to FIGS. 7A, 7B and 8.

Figure 7A:
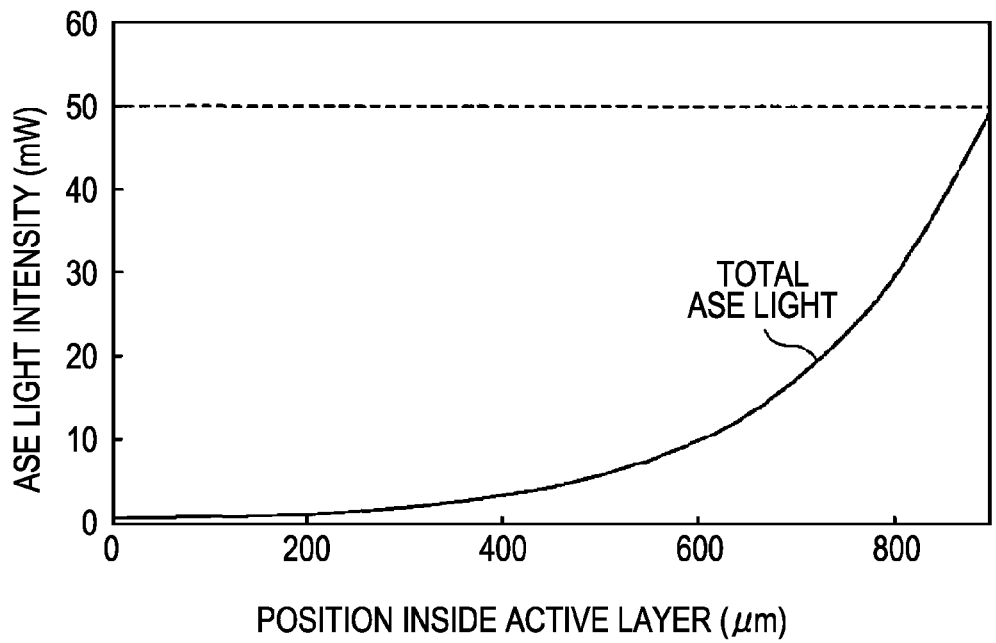
FIGS. 7A and 7B are explanatory views of ASE light intensity of the semiconductor optical amplifier.
Figure 7B:
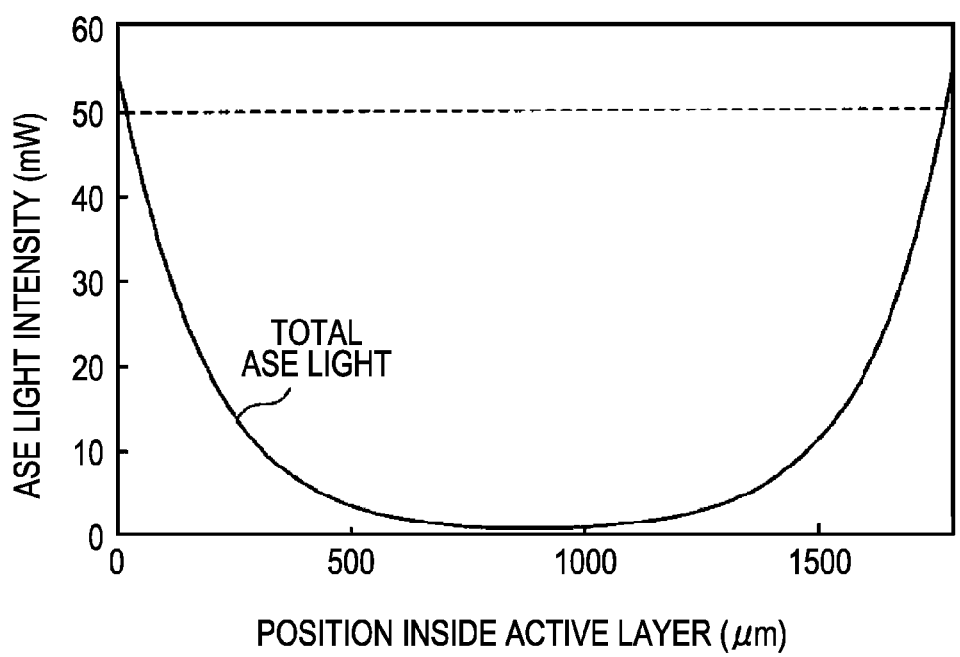

As illustrated in FIG. 7A, ASE light whose intensity is about 50 mW at an edge of the optical waveguide where an antireflection film is formed, can be obtained in the semiconductor optical amplifier according to the present embodiment by applying a current of current density of about 20 kA/cm$^2$. The driving current passed during application is about 540 mA and the length of the semiconductor optical amplifier in the traveling direction of signal light is about 900 μm. In the semiconductor optical amplifier illustrated in FIG. 1A, on the other hand, the length of the semiconductor optical amplifier in the traveling direction of signal light needs to be, as illustrated in FIG. 7B, about 1800 μm to obtain ASE light whose intensity is about 50 mW and the driving current passed during application is about 1080 mA. Accordingly, when ASE light of the same intensity is obtained, the semiconductor optical amplifier in the present embodiment can make the length in the traveling direction of signal light half the length of the semiconductor optical amplifier of related technology illustrated in FIG. 1A and also the driving current can be halved.

Figure 8:
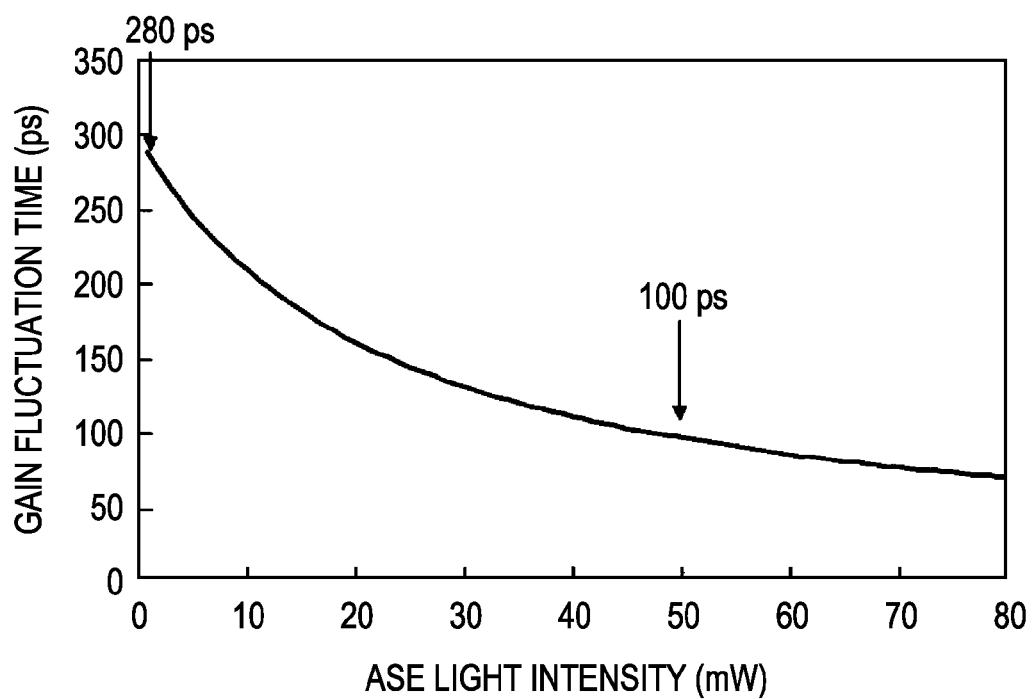
FIG. 8 is a correlation diagram between the ASE light intensity and a gain response time.

Next, FIG. 8 illustrates the relationship between ASE light intensity and a gain response time. In the semiconductor optical amplifier illustrated in FIG. 1A, if the length of the semiconductor optical amplifier in the traveling direction of signal light is about 900 μm, intensity of ASE light at an edge of the optical waveguide is about 0.4 mW and the gain response time therefor is about 280 ps. In the semiconductor optical amplifier according to the present embodiment, on the other hand, intensity of ASE light at the edge on the emission side of signal light of the optical waveguide is about 50 mW and the gain response time therefor is shortened to about 100 ps when the length of the semiconductor optical amplifier in the traveling direction of signal light is about 900 μm. That is, the semiconductor optical amplifier in the present embodiment can achieve an almost three-fold speedup when compared with the semiconductor optical amplifier of related technology illustrated in FIG. 1A. Thus, the semiconductor optical amplifier in the present embodiment can shorten the gain response time and suppress waveform deterioration due to a pattern effect.

Figure 9A:
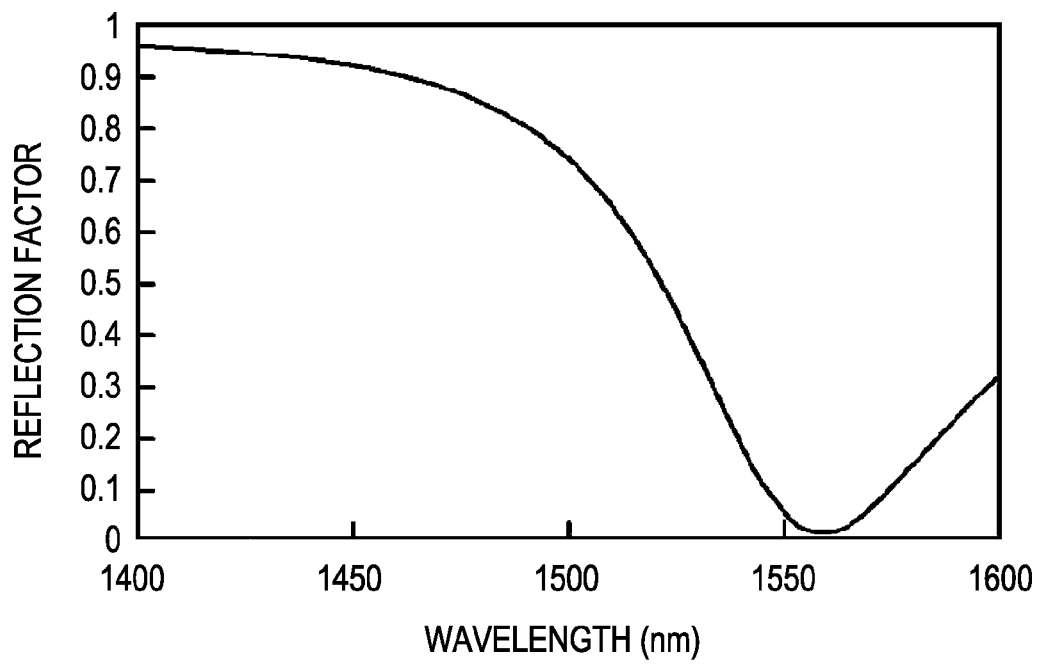
FIGS. 9A and 9B are characteristics diagrams of other wavelength selective reflection films.
Figure 9B:
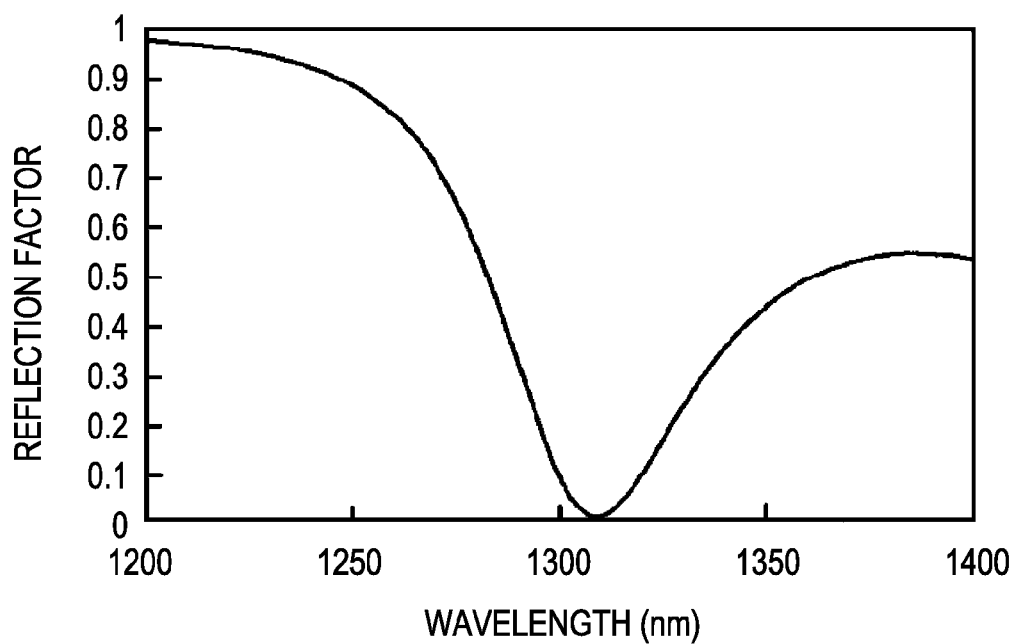

Next, the wavelength selective reflection film 13 of another structure will be described based on FIGS. 9A and 9B. FIG. 9A illustrates reflection factor characteristics of the wavelength selective reflection film 13 of a dielectric multi-layer film built by forming 10 layers each comprising an SiO$_2$ layer with the refractive index of about 1.44 and thickness of about 180 nm and an SiN (silicon nitride) film with the refractive index of about 2.0 and thickness of about 200 nm alternately. By using such a dielectric multi-layer film, it is possible to obtain the wavelength selective reflection film 13 having characteristics permitting light transmission at 1550 nm, which is the wavelength of signal light, with almost no reflection while the reflection factor of light of the wavelength 1470 nm, which is the peak wavelength of ASE light, is 90% or more.

The semiconductor optical amplifier in the present embodiment is also applicable when the wavelength of signal light is 1300 nm. FIG. 9B illustrates reflection factor characteristics of the wavelength selective reflection film 13 of a dielectric multi-layer film built by forming eight layers with each comprising an SiO$_2$ layer with the refractive index of about 1.44 and thickness of about 160 nm and an TiO$_2$ film with the refractive index of about 2.4 and thickness of about 120 nm alternately. By using such a dielectric multi-layer film, it is possible to obtain the wavelength selective reflection film 13 having characteristics permitting light transmission at 1300 nm, which is the wavelength of signal light, with almost no reflection while the reflection factor of light of the wavelength 1250 nm, which is the peak wavelength of ASE light, is 90% or more. In both examples, for example, the EB (electron beam) evaporation method is used to form each film. Here, the number of repeated layers of the wavelength selective reflection film is not limited to 8 or 10 layers and may use a single layer to 20 layers or more in accordance with reflection characteristics necessary for the wavelength selective reflection film. More specifically, if the shape of reflection spectrum should be made steeper (the slope forming the transmission waveband in FIG. 6 is close to perpendicular), a larger number of repeated layers are selected and, if steepness is not necessary, a smaller number of repeated layers are selected. The thickness of each layer is adjusted in the range of 10 nm to 500 nm in accordance with the necessary transmission center wavelength. Any material having the refractive index of 1.5 to 3.0 may be used as the film material.

Figure 10:
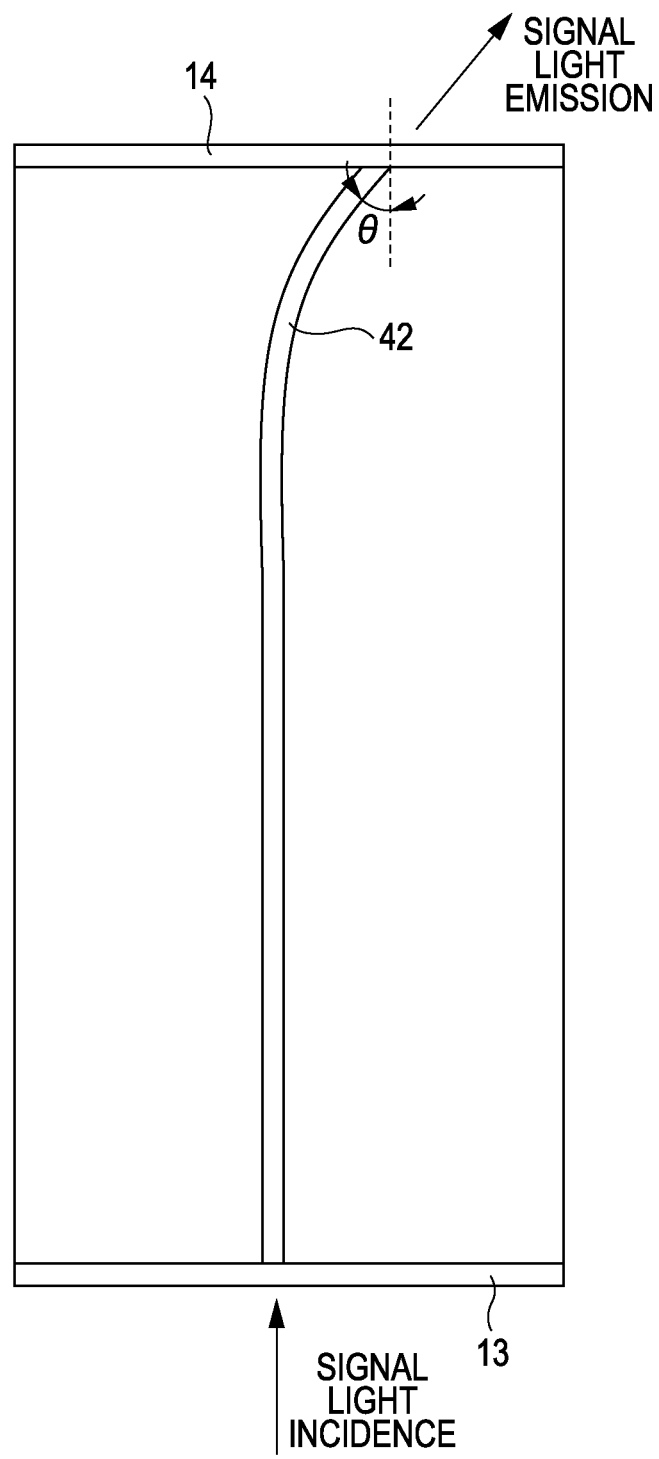
FIG. 10 is an explanatory view of another semiconductor optical amplifier in the first embodiment.

Further, as illustrated in FIG. 10, reflection of ASE light on the end face on the emission side of signal light can further be suppressed by forming the optical waveguide with a structure tilted from the direction perpendicular to the end surface at the output facet of SOA. FIG. 10 provides a profile from the top surface of the semiconductor optical amplifier. The semiconductor optical amplifier causes signal light to emit at an angle θ (5 to 20 degrees) with respect to the direction perpendicular to the end surface on the emission side of the signal light and thus, an optical waveguide 42, which is an active layer, is in a bent shape. Accordingly, even a slight amount of light reflected on the end face on the emission side of the signal light where the antireflection film 14 is formed will not go back to the optical waveguide 42 so that resonance of ASE light in the optical waveguide 42 can reliably be prevented.

[Second Embodiment]

Next, the second embodiment will be described. A semiconductor optical amplifier in the present embodiment includes an active layer in a quantum dot (QD) structure.

Figure 11A:
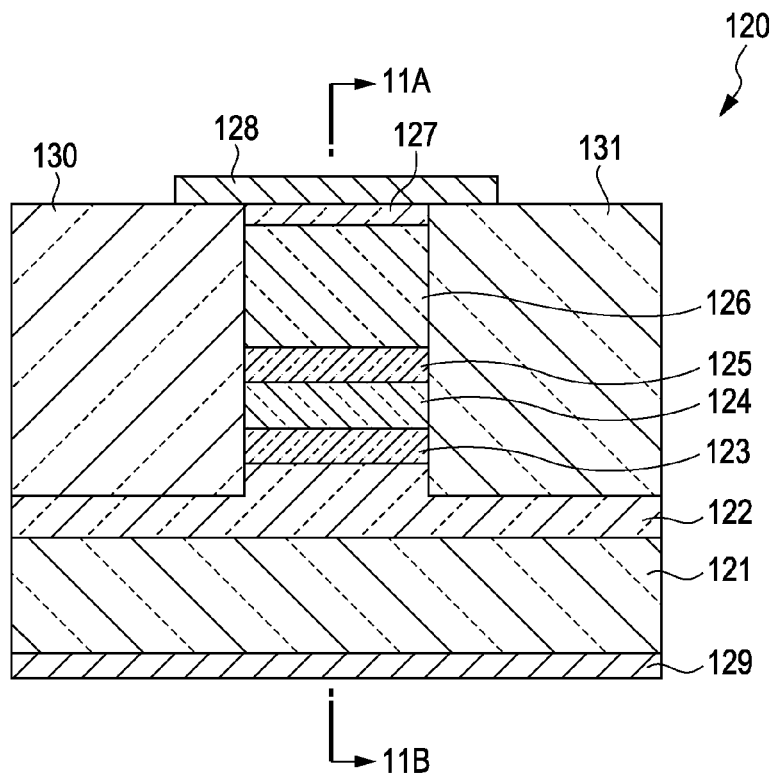
FIGS. 11A and 11B are structure diagrams of the semiconductor optical amplifier in a second embodiment.
Figure 11B:
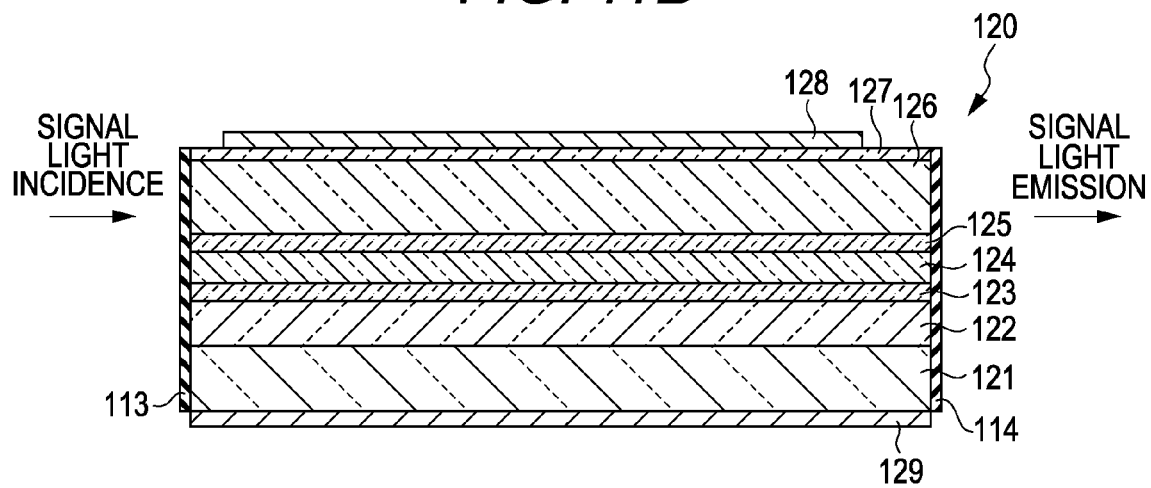

A semiconductor optical amplifier 120 in the present embodiment will be described based on FIGS. 11A and 11B. FIG. 11A is a sectional view of the semiconductor optical amplifier on a surface substantially perpendicular to the traveling direction of signal light and FIG. 11B is a sectional view of a section cut along a chain line 11A-11B in FIG. 11A. The semiconductor optical amplifier 120 includes, for example, an n-type InP clad layer 122, InGaAsP optical confinement layer 123, InGaAs active layer 124, InGaAsP optical confinement layer 125, p-type InP clad layer 126, and InGaAsP contact layer 127 laminated on an n-type InP substrate 121. Further, for example, an anode electrode 128 is formed on the InGaAsP contact layer 127 and a cathode electrode 129 is formed on a surface opposite to the surface on which the n-type InP clad layer 122 of the n-type InP substrate 121 is formed. The InGaAsP optical confinement layer 123, the InGaAs active layer 124, the InGaAsP optical confinement layer 125, the p-type InP clad layer 126, the InGaAsP contact layer 127, and a portion of the n-type InP clad layer 122 have a mesa structure. I-type InP block layers 130 and 131 are provided on the side surface of the mesa structure. Further, a wavelength selective reflection film 113 is formed on the incidence surface of signal light and an antireflection film 114 is formed on the emission surface of the signal light.

Next, the manufacturing method of a semiconductor optical amplifier in the present embodiment will be described based on FIGS. 12A to 12D. FIGS. 12A to 12D illustrate processes of the manufacturing method of a semiconductor optical amplifier in the present embodiment and are sectional views of the semiconductor optical amplifier on a surface substantially perpendicular to the traveling direction of signal light.

Figure 12A:
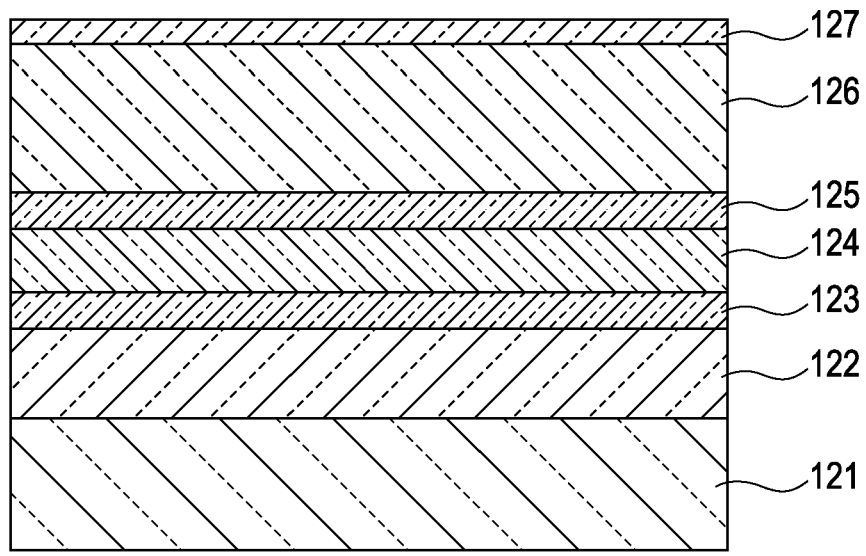
FIGS. 12A to 12D are manufacturing process diagrams of the semiconductor optical amplifier in the second embodiment.

As illustrated in FIG. 12A, each layer is formed on the n-type InP substrate 121. For example, the n-type InP clad layer 122 (for example, the thickness is 100 nm to 3000 nm), the InGaAsP optical confinement layer 123 (for example, the thickness is 10 nm to 300 nm), the quantum dot active layer 124 (for example, the thickness is 10 nm to 500 nm), the InGaAsP optical confinement layer 125 (for example, the thickness is 10 nm to 300 nm), the p-type InP clad layer 126 (for example, the thickness is 300 nm to 4000 nm), and the InGaAsP contact layer 127 (for example, the thickness is 100 nm to 1000 nm) are formed on the n-type InP substrate 121. The formation method to be used is the MOVPE method or MBE method and each layer is formed by epitaxial growth.

Figure 13:
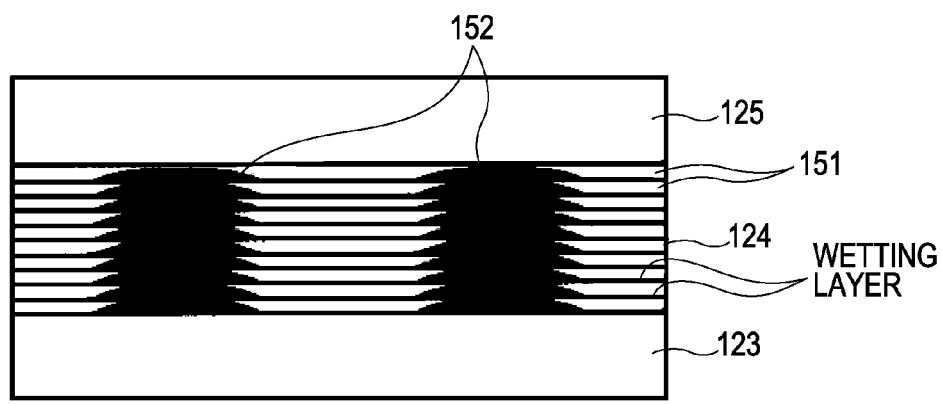
FIG. 13 is an enlarged structure diagram of a quantum dot active layer.

Next, the quantum dot active layer 124 will be described. FIG. 13 is an enlarged structure diagram of the quantum dot active layer 124. As illustrated in FIG. 13, the quantum dot active layer 124 includes, for example, a side barrier 151 (for example, the thickness is 2 nm to 50 nm) of GaInAsP and a quantum dot 152 (for example, the thickness is 2 nm to 50 nm) of InAs. The quantum dot 152 is formed by using self-organization technology such as Stranski-Krastanov (S-K) mode. Since the quantum dot 152 is a columnar dot, the side barrier 151 is formed around the dot.

Figure 12B:
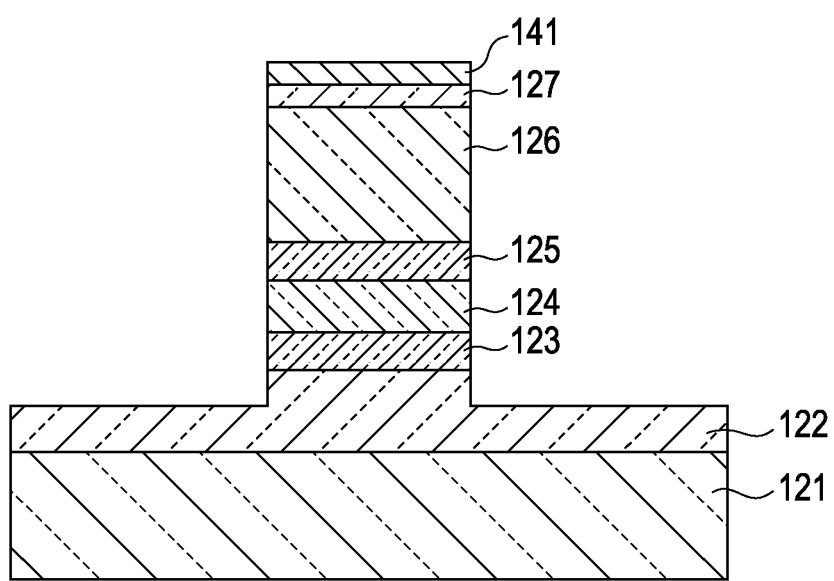

Next, as illustrated in FIG. 12B, a region to become an optical waveguide is processed to a mesa structure. For example, an SiO₂ (silicon dioxide) mask 141 to be a mask is formed on the InGaAsP contact layer 127. After an SiO₂ film is formed on the InGaAsP contact layer 127, the SiO₂ (silicon dioxide) mask 141 is formed by removing the SiO₂ film in a region where no resist pattern is formed using the resist pattern formed by photolithography as a mask. An etching method such as RIE is used to remove the SiO₂ film and then, the resist pattern is removed. The SiO₂ mask 141 is used to process the InGaAsP optical confinement layer 123, the quantum dot active layer 124, the InGaAsP optical confinement layer 125, the p-type InP clad layer 126, the InGaAsP contact layer 127, and a portion of the n-type InP clad layer 122 (for example, the remaining film thickness is about 0 nm to 3000 nm) to a mesa structure. Processing to a mesa structure is performed by dry etching or the like using the SiO₂ mask 141.

Figure 12C:
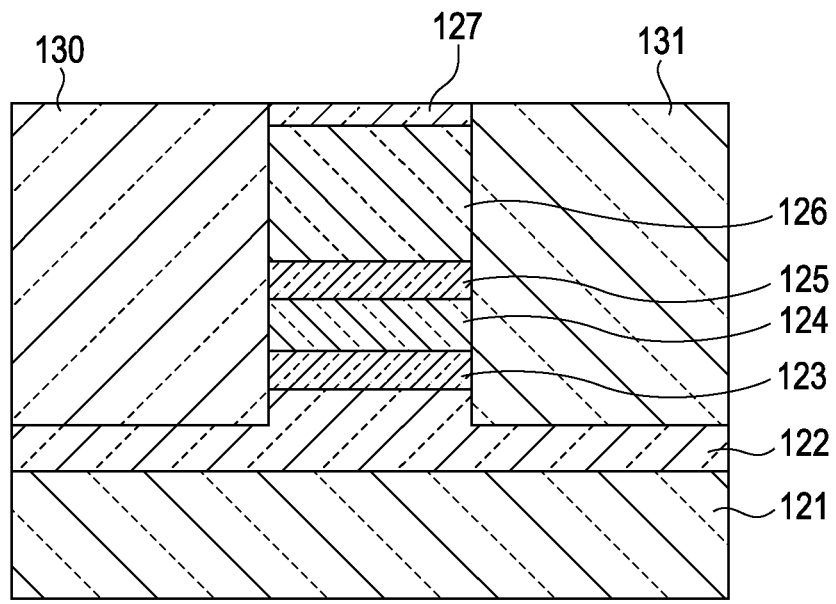

As illustrated in FIG. 12C, i-type InP block layers 130 and 131 are formed on the side surface processed to the mesa structure. As the formation method, for example, the MOCVD method is used. For example, the i-type InP block layers 130 and 131 are formed by growing an i-type InP film with high resistance on the dry-etched surface of the n-type InP clad layer 122 and then, the SiO₂ mask 141 is removed. The i-type InP block layers 130 and 131 formed on both sides of the quantum dot active layer 124 will become a current narrowing layer.

Figure 12D:
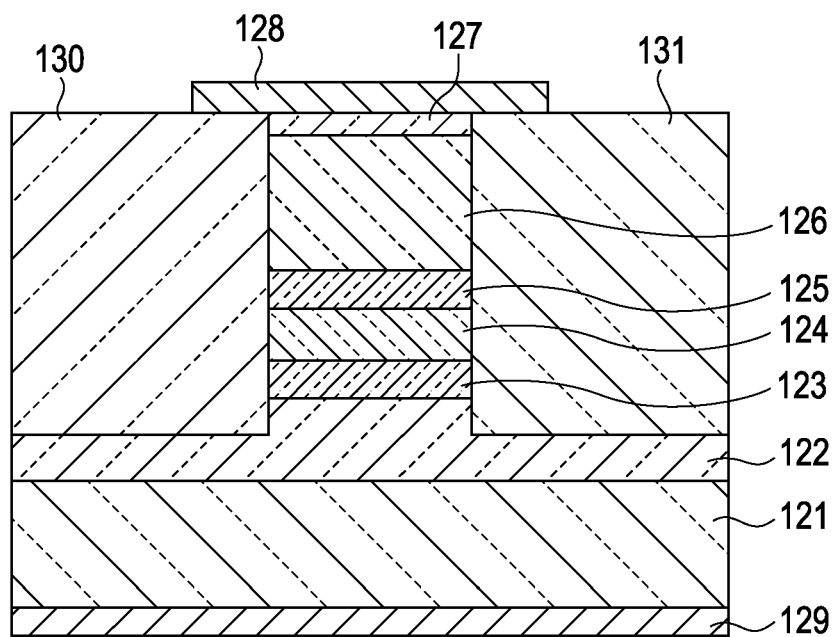

Next, as illustrated in FIG. 12D, the anode electrode 128 and the cathode electrode 129 are formed. For example, the anode electrode 128 is formed on the InGaAsP contact layer 127 and the cathode electrode 129 is formed on the underside of the n-type InP substrate 121 where the n-type InP clad layer 122 or the like is not formed. For example, Au (about 100 nm to 2000 nm), Zn (about 100 nm to 2000 nm), or Au (about 100 nm to 5000 nm) are used as the configuration of both electrodes.

Then, an incidence surface (end face on the incidence side) and an emission surface (end face on the emission side) of signal light are formed by cleaving surfaces substantially perpendicular to the traveling direction of signal light. Further, on the end face on the emission side of the signal light, for example, an SiO₂ (silicon dioxide) film with the refractive index of about 1.44 and thickness of about 100 nm and TiO₂ (titanium oxide) with the refractive index of about 2.4 and thickness of about 300 nm are alternately formed to build a dielectric multi-layer film in which, for example, eight layers are each formed to result in the antireflection film 114. The antireflection film 114 is used to prevent reflection of ASE light and signal light. Moreover, on the end face on the incidence side of the signal light, for example, an SiO₂ film with the thickness of about 190 nm and TiO₂ with the thickness of about 150 nm are alternately formed to build a dielectric multi-layer film in which, for example, eight layers are each formed result in the wavelength selective reflection film 113. Accordingly, the semiconductor optical amplifier 120 illustrated in FIG. 11B can be fabricated.

Since the semiconductor optical amplifier 120 in the present embodiment has the quantum dot active layer 124, it becomes possible to make the gain response speed faster and also to keep temperature dependence to a minimum. The semiconductor optical amplifier in the present embodiment may use a structure other than the columnar quantum dot such as a single-layer S-K self-organization quantum dot as the quantum dot active layer 124. Alternatively, an active layer in a quantum well structure may be applied. Further, it is also possible to cause the semiconductor optical amplifier 120 to operate regardless of the state of polarization by using, for example, a technique to apply strains to active layer materials of various structures.

In the semiconductor optical amplifier 120 according to the present embodiment, instead of the n-type InP substrate 121, an n-type GaAs substrate may be used. Further, a semiconductor optical amplifier having electric characteristics opposite to those of the above semiconductor optical amplifier may be applied by using p-type InP and p-type GaAs as the conduction type of substrate and replacing the clad layer over the active layer by an n-type semiconductor. Moreover, the MBE (molecular beam epitaxy) method or the like may be used to form the n-type InP clad layer 122, the InGaAsP optical confinement layer 123, the InGaAs active layer 124, the InGaAsP optical confinement layer 125, the p-type InP clad layer 126, and the InGaAsP contact layer 127. Further, in the semiconductor optical amplifier according to the present embodiment, the wavelength selective reflection film in the first embodiment described with reference to FIGS. 9A and 9B may also be used.

[Third Embodiment]

The present embodiment is a semiconductor optical amplifier including a structure in which a diffraction grating is provided on the incidence side of signal light.

Figure 14:
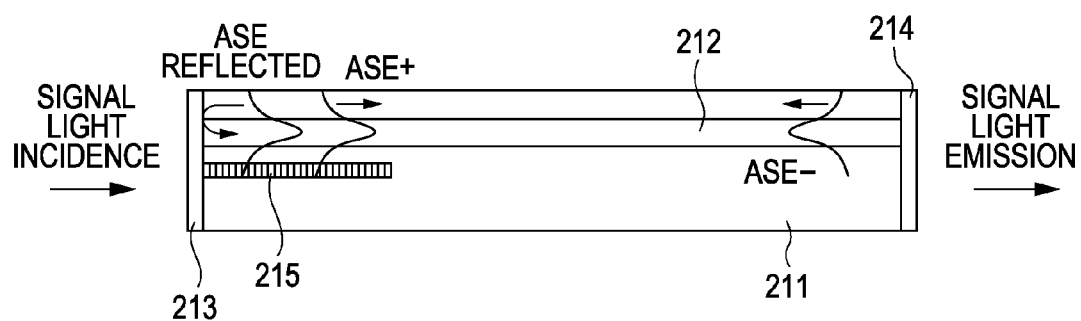
FIG. 14 is a structure diagram of the semiconductor optical amplifier in a third embodiment.

The semiconductor optical amplifier illustrated in FIG. 14 is constructed by an active layer 212 to be an optical waveguide being formed on a semiconductor substrate 211 and the active layer 212 is sandwiched by clad layers (not illustrated) provided. Antireflection films 213 and 214 to prevent optical losses by reflection and optical resonance are formed on the incidence surface and emission surface of signal light of the semiconductor optical amplifier respectively and a diffraction grating 215 is provided below the active layer 212 on the incidence side of signal light. The diffraction grating 215 is used to reflect ASE light generated inside the active layer 212 and transmit signal light. The period $\Lambda$ of the diffraction grating 215 is set, using the relation of the reflection wavelength $\lambda$ thereof being given by $\lambda=2 \cdot n \cdot \Lambda$ (n is an equivalent refractive index of the waveguide and is about 3 to 3.5), for example, between 100 nm and 400 nm in accordance with the necessary reflection wavelength. If, for example, the ASE peak wavelength SOA is 1450 nm, $\Lambda$ is set to about 226 nm (n is set to n=3.3).

In the active layer 212, a light (ASE+) propagating in the same direction as signal light and a light (ASE−) propagating in the opposite direction are generated. Of these lights, ASE− is reflected by the diffraction grating 215 to become a light (ASE reflected) propagating in the same direction as the signal light, and (ASE reflected) is further amplified during its propagation toward output facet by an optical gain in optical active layer. Thus, like the first embodiment, intensity of the total ASE light, which is the sum of intensity of ASE+, that of ASE−, and that of ASE reflected, becomes much higher at the end of the active layer 212 on the emission side of signal light.

Incidentally, the diffraction grating 215 may be provided on the upper side of the active layer 212 and may be a chirped diffraction grating in which the period or form of surface grating or a diffraction grating is not uniform and the period or form changes depending on the traveling direction of signal light in the optical waveguide to obtain a high reflection factor for ASE light in a wide wavelength region. Moreover, the active layer 212 may be applied to both the active layer in the first embodiment and the quantum dot active layer in the second embodiment.

[Fourth Embodiment]

The present embodiment is an optical module into which a semiconductor optical amplifier is incorporated.

An optical module in the present embodiment will be described based on FIGS. 15 and 16. The optical module in the present embodiment includes, as illustrated, for example, in FIG. 15, an optical fiber 301, an optical system 302, the semiconductor optical amplifier 20 in the first embodiment, an optical system 304, an optical fiber 305, a stage 306, and a wavelength filter 351. In the present embodiment, a case in which the semiconductor optical amplifier 20 in the first embodiment is used is described as an example, but the optical module in the present embodiment may similarly be used when a semiconductor optical amplifier in the second or third embodiment is used. An input signal light is incident on the semiconductor optical amplifier 20 from the optical fiber 301 via the optical system 302. The signal light emitted from the semiconductor optical amplifier 20 is output to the optical fiber 305 via the optical system 304. The stage 306 has a temperature adjustment function and the semiconductor optical amplifier 20 is maintained at a substantially fixed temperature. The wavelength filter 351 is a wavelength selective filter (a wavelength selective filter using a dielectric multi-layer film on glass substrate), is provided at some midpoint of the optical fiber 305, and has characteristics to prevent ASE light and to transmit signal light.

The optical system 302 has lenses 307 and 308 to couple a signal light from the optical fiber 301 to the incidence surface of the semiconductor optical amplifier 20. The optical system 304 includes lenses 309 and 310 to couple a signal light emitted from the semiconductor optical amplifier 20 to the optical fiber 305.

Figure 16:
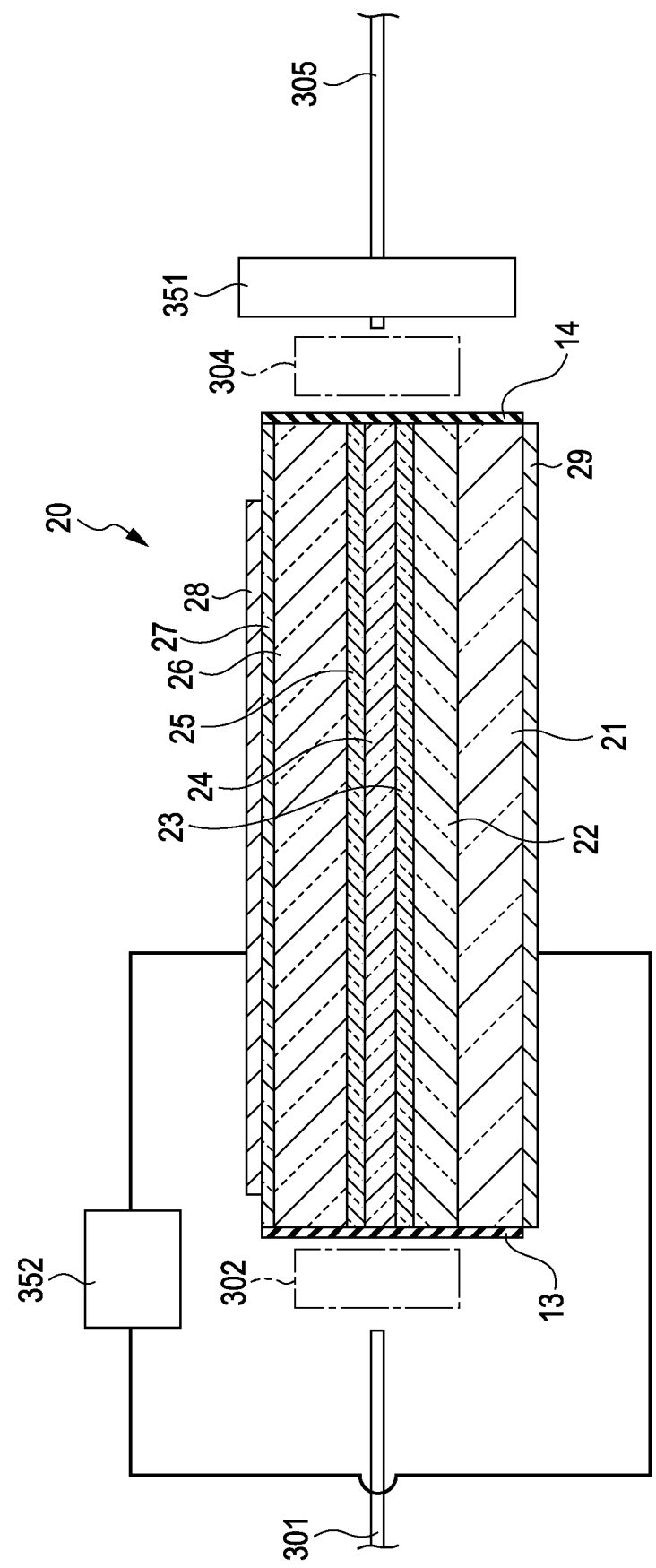
FIG. 16 is a structure diagram of an optical signal processing apparatus inside the optical module.

As illustrated in FIG. 16, the semiconductor optical amplifier 20 in the optical module is driven by a driving circuit 352 to be a power supply. That is, the driving circuit 352 is electrically connected to the anode electrode 28 and the cathode electrode 29 of the semiconductor optical amplifier 20 and drives the semiconductor optical amplifier 20 by providing a current to the semiconductor optical amplifier 20.

When a signal light is incident on the semiconductor optical amplifier 20 from the optical fiber 301 via the optical system 302 while a current is passed to the semiconductor optical amplifier 20, the signal light emitted from the semiconductor optical amplifier 20 is output to the optical fiber 305 via the optical system 304. As described above, the optical fiber 305 includes the wavelength filter 351 provided at some midpoint thereof so that ASE light is prevented.

Figure 15:
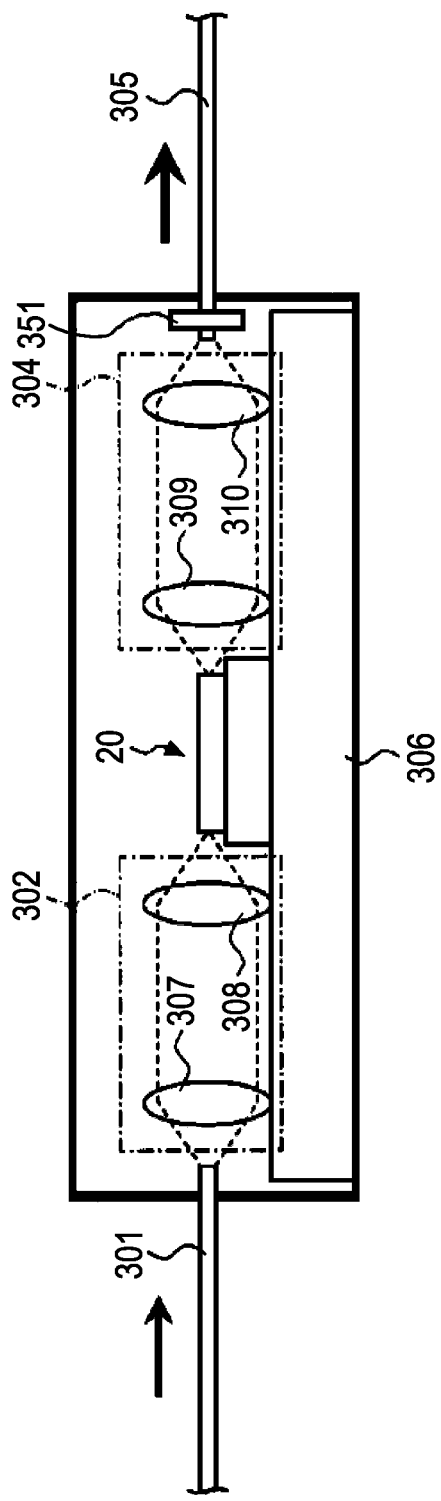
FIG. 15 is a structure diagram of an optical module in a fourth embodiment.
Figure 17A:
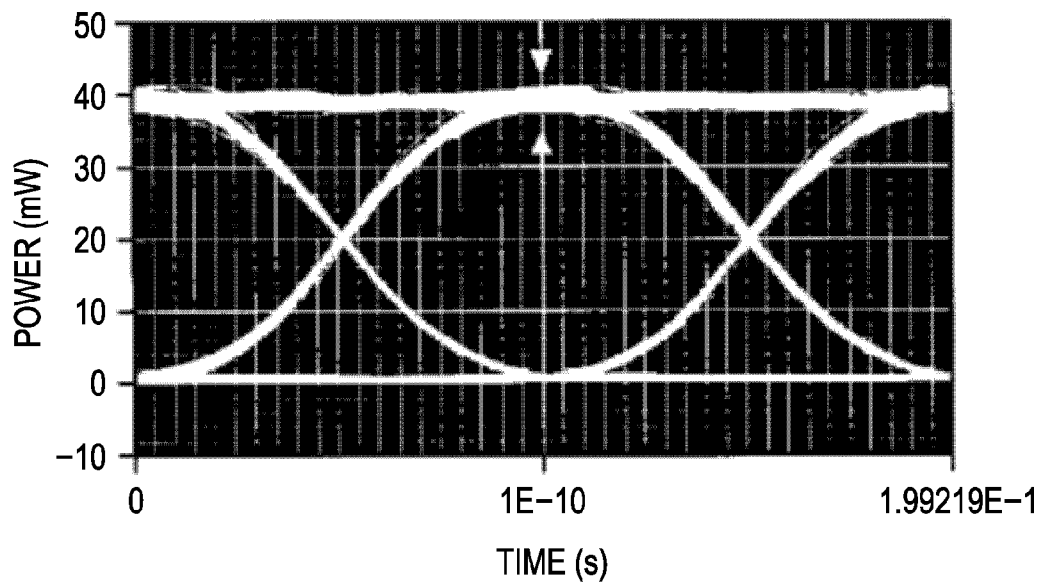
FIGS. 17A and 17B are signal waveform diagrams of an input signal and an output signal.
Figure 17B:
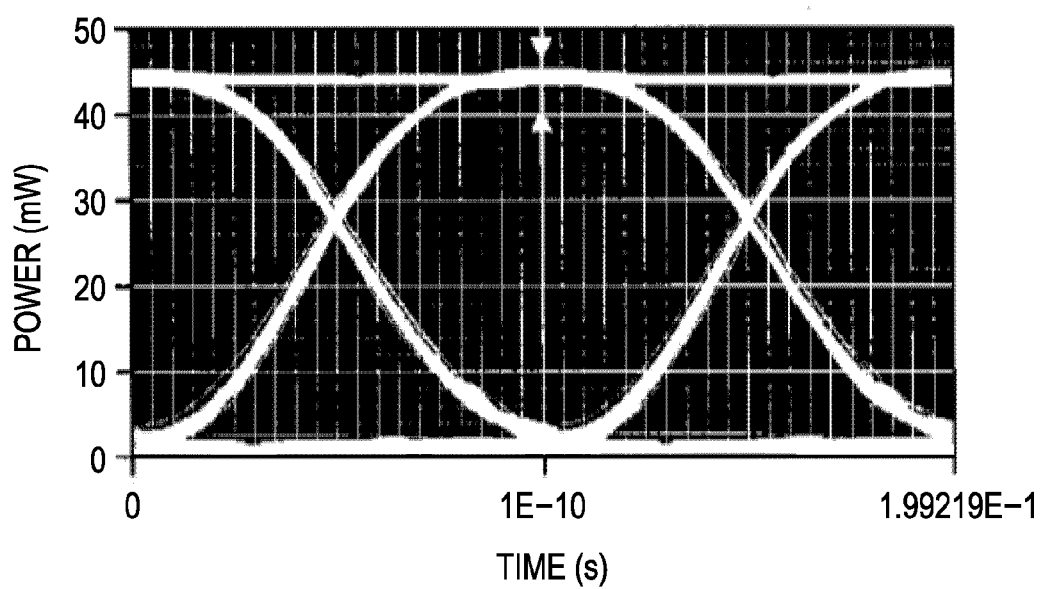

FIGS. 17A and 17B illustrates an input signal waveform input into the optical module illustrated in FIG. 15 and an output signal waveform output from the optical module. FIG. 17A illustrates the input signal waveform input into the optical module illustrated in FIG. 15 and FIG. 17B illustrates the output signal waveform output from the optical module illustrated in FIG. 15. An input signal illustrated in FIG. 17A is a Non Return to Zero (NRZ) modulated signal light at 10 Gbps and a signal containing a large amount of noise at the "1" level. Noise at the "1" level is compressed in intensity due to an effect of fast gain saturation in the semiconductor optical amplifier 20 thorough the amplification to a level of gain saturation region of the semiconductor optical amplifier 20, so that an "optical limiter amplification operation" which improve quality of signal light can be realized. In the output signal waveform illustrated in FIG. 17B, eye patterns are more widely opened than those in the input signal waveform, confirming that quality of the output signal light is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A semiconductor optical amplifier comprising:
   a semiconductor substrate;
   an optical waveguide that includes an active layer formed over the semiconductor substrate; and
   a wavelength selective reflection film that is formed on an end face of the optical waveguide, transmits signal light, and reflects a spontaneous emission generated by the active layer.

2. The semiconductor optical amplifier according to claim 1, further comprising:
   a diffraction grating that is formed above and/or below the optical waveguide on a side on which signal light is input to the optical waveguide, transmits the signal light, and reflects light of any wavelength other than the signal light.

3. The semiconductor optical amplifier according to claim 1, further comprising:
   an antireflection film formed on the end face where the signal light is emitted from the waveguide to prevent reflection of the signal light and the light of any wavelength other than signal light.

4. The semiconductor optical amplifier according to claim 1, wherein
   the wavelength selective reflection film is a dielectric multi-layer film.

5. The semiconductor optical amplifier according to claim 4, wherein
   the dielectric multi-layer film is a laminated film of a first refractive index material containing oxide or nitride and a second refractive index material containing another oxide or another nitride.

6. The semiconductor optical amplifier according to claim 1, wherein
   the active layer includes a quantum well structure.

7. The semiconductor optical amplifier according to claim 1, wherein
   the active layer is a quantum dot active layer.

8. The semiconductor optical amplifier according to claim 7, wherein
   the quantum dot active layer includes a quantum dot of InAs formed inside GaInAsP.

9. The semiconductor optical amplifier according to claim 1, wherein
the signal light is emitted at an angle tilted with respect to a direction substantially perpendicular to an opposite end face of the optical waveguide.

10. The semiconductor optical amplifier according to claim 1, wherein
a peak of the wavelength of the signal light is a longer wavelength than a peak of the wavelength of a spontaneous emission.

11. The semiconductor optical amplifier according to claim 4, wherein
the dielectric multi-layer film is a laminated film of titanium oxide and silicon oxide.

12. The semiconductor optical amplifier according to claim 4, wherein
the dielectric multi-layer film is a laminated film of silicon nitride and silicon oxide.

13. The semiconductor optical amplifier according to claim 1, further comprising:
a pair of electrodes formed above and below the active layer; and a power supply to apply a voltage to the electrodes.

14. A optical module comprising:
a semiconductor optical amplifier including:
a semiconductor substrate;
an optical waveguide that includes an active layer formed on the semiconductor substrate; and
a wavelength selective reflection film that is formed on an end face of the optical waveguide, transmits the signal light, and reflects a spontaneous emission generated by the active layer;
an optical element that causes the signal light to be incident on the optical waveguide in the semiconductor optical amplifier; and
an optical element that outputs the signal light emitted from the optical waveguide in the semiconductor optical amplifier.

15. The optical module according to claim 14, wherein
the semiconductor optical amplifier further includes
a diffraction grating that is formed above and/or below the optical waveguide on a side on which signal light is input to the optical waveguide, transmits the signal light, and reflects light of any wavelength other than the signal light.

16. The optical module according to claim 14, further comprising:
a pair of electrodes formed above and below the active layer of the semiconductor optical amplifier; and
a power supply to apply a voltage to the electrodes.

17. The optical module according to claim 14, further comprising:
a wavelength selective filter that is arranged on an emission side of the signal light from the semiconductor optical amplifier and has a lower transmittance of a spontaneous emission than the transmittance of the signal light.

18. The optical module according to claim 14, wherein
the optical element includes an optical fiber.

* * * * *